United States Patent
Mirzaei et al.

(10) Patent No.: US 8,237,507 B1
(45) Date of Patent: Aug. 7, 2012

(54) METHOD AND SYSTEM FOR TRANSMITTER LINEARIZATION

(75) Inventors: Ahmad Mirzaei, San Diego, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/047,444

(22) Filed: Mar. 14, 2011

(51) Int. Cl.
*H03F 3/04* (2006.01)
(52) U.S. Cl. .................................. 330/296; 330/285
(58) Field of Classification Search .................. 330/296, 330/285
See application file for complete search history.

(56) References Cited

U.S. PATENT DOCUMENTS

| | | | | |
|---|---|---|---|---|
| 3,708,756 | A * | 1/1973 | Fajen | 330/296 |
| 6,717,473 | B1 * | 4/2004 | Bernard et al. | 330/296 |
| 7,990,221 | B2 * | 8/2011 | Koizumi et al. | 330/285 |

* cited by examiner

*Primary Examiner* — Henry Choe
(74) *Attorney, Agent, or Firm* — Sterne, Kessler, Goldstein & Fox PLLC

(57) ABSTRACT

Aspects of a method and system for transmitter linearization are provided. A signal may be amplified via one or more circuits comprising a first transistor having a first bias voltage applied to its gate via a resistor, and a second transistor having its source coupled to a first terminal of the resistor, its drain coupled to a second terminal of the resistor, and its gate coupled to a second bias voltage. The signal may be AC-coupled, via one or more capacitors, for example, to the gate of the first transistor. The first bias voltage and the second bias voltage may be such that the first transistor operates in the active region the second transistor operates in the subthreshold region. The effective channel width of the second transistor may be configurable during operation of the one or more circuits.

20 Claims, 6 Drawing Sheets

METHOD AND SYSTEM FOR TRANSMITTER LINEARIZATION

FIELD OF THE INVENTION

Certain embodiments of the invention relate to electronic communications. More specifically, certain embodiments of the invention relate to a method and system for transmitter linearization.

BACKGROUND OF THE INVENTION

As the number of wireless standards and the range of frequencies of wireless communications continue to increase, there is increasing need for communication receivers that are capable of handling multiple wireless standards spanning a wide range of frequencies. Also, as the number of wireless devices and the amount of wireless communications taking place increase, these communication transceivers have to function satisfactorily in the presence of large amounts of noise and interference.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for transmitter linearization, substantially as illustrated by and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for transmitter linearization. In various embodiments of the invention, a signal may be amplified via one or more circuits comprising a first transistor having a first bias voltage applied to its gate via a resistor, and a second transistor having its source coupled to a first terminal of the resistor, its drain coupled to a second terminal of the resistor, and its gate coupled to a second bias voltage. The signal may be AC-coupled, via one or more capacitors, for example, to the gate of the first transistor. The first bias voltage and the second bias voltage may be such that they coincide with the first transistor operating in the active region and the second transistor operating in the subthreshold region. The first transistor may be in a common-source configuration. The first transistor may be one transistor of a differential pair. The effective channel width of the second transistor may be configurable during operation of the one or more circuits. The effective channel width of the second transistor may be configured based on, for example, characteristics of the signal, temperature, and/or supply voltage provided to the one or more circuits.

The one or more circuits may comprise a plurality of transconductance cells, wherein each of the plurality of transconductance cells may be configurable, during operation of the one or more circuits, between an enabled configuration and a disabled configuration. Each of the plurality of transconductance cells may comprise two instances of the first transistor configured as a differential pair. Each of the plurality of transconductance cells may comprise one or more cascode transistors and may be enabled or disabled based on a voltage applied to a gate of the one or more cascode transistors.

Figure 1:
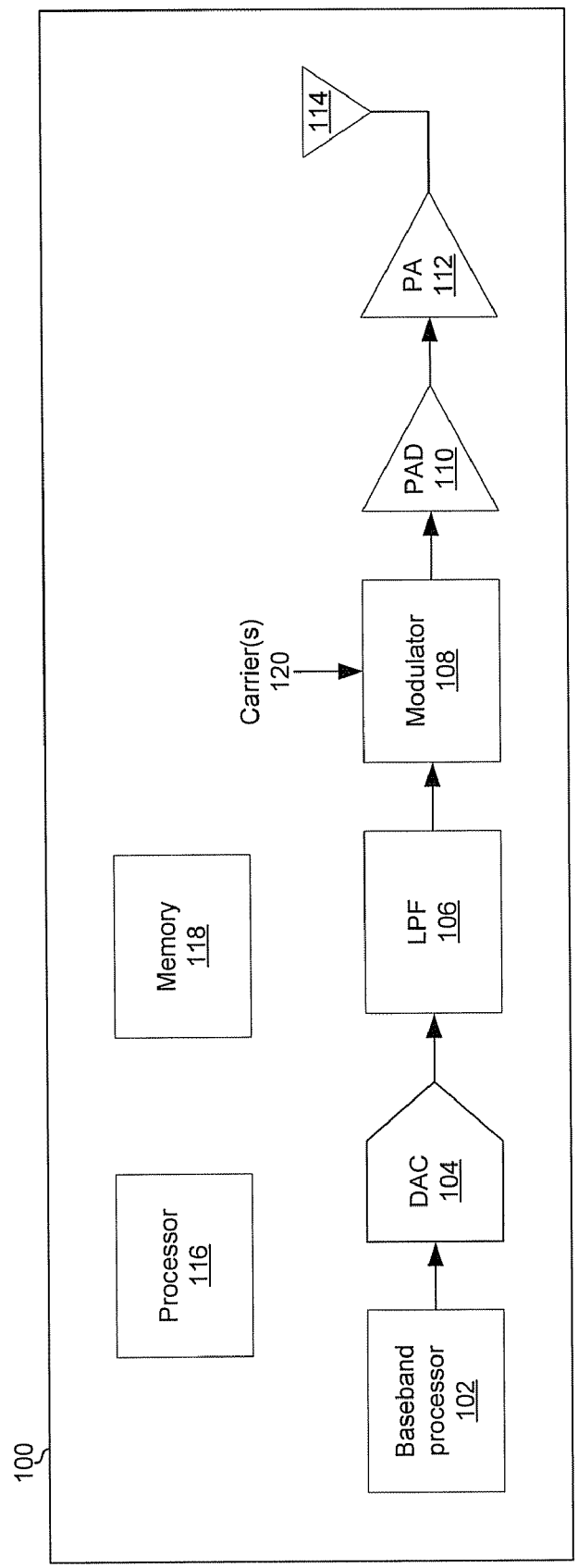
FIG. 1 is a block diagram illustrating an exemplary communication device, in accordance with an embodiment of the invention.

FIG. 1 is a block diagram illustrating an exemplary communication device, in accordance with an embodiment of the invention. Referring to FIG. 1, there is shown a communication device 100 comprising a processor 116, and a memory 118, a digital signal processor (DSP) 102, an digital-to-analog converter (DAC) 104, a low-pass filter (LPF) 106, a modulator 108, a power amplifier driver (PAD) 110, a power amplifier (PA) 112, and an antenna 114.

The processor 116 and the memory 118 may comprise suitable logic, circuitry, interfaces and/or code that may enable processing data and/or controlling operations of the communication device 100. The memory 118 may comprise, for example, SRAM, DRAM, and/or non-volatile memory that stores data and/or instructions. The processor 116, utilizing the memory 118, may be operable to execute code to effectuate operation of the communication device 100. For example, the processor 116 may execute code stored in the memory 118 to execute an operating system and/or configure and/or control the digital signal processor 102, the DAC 104, the low-pass filter 106, the modulator 108, the power amplifier driver (PAD) 110, and the power amplifier (PA) 112. The processor 116 may generate control signals based on, for example, characteristics of the baseband signal generated by the baseband processor 102, environmental conditions in which the device 100 is operating, a wireless standard according to which the device 100 is transmitting, supply voltage levels in the device 100, and a frequency on which the device 100 is transmitting.

The baseband processor 102 may comprise suitable logic, circuitry, interfaces, and/or code that may be operable to process and/or generate baseband signals. The baseband processor 102 may be operable to generate baseband signals and output the baseband signals to the DAC 104. The baseband processor 102 may also be operable to provide control and/or feedback signals to configure one or more of the DAC 104, the LPF 106, the modulator 108, the PAD 110, and the PA 112. The control signals may be based on, for example, characteristics of the baseband signal generated by the baseband processor 102, environmental conditions in which the device 100 is operating, a wireless standard according to which the device 100 is transmitting, supply voltage levels in the device 100, and a frequency on which the device 100 is transmitting.

The DAC 104 may comprise suitable logic, circuitry, interfaces, and/or code operable to convert a digital signal to an analog representation.

The LPF 106 may comprise suitable logic, circuitry, interfaces, and/or code having a frequency response such that frequencies below a corner frequency are attenuated less than frequencies above the corner frequency. The corner frequency may be controlled via, for example, a control signal from processor 116 and/or the DSP 102.

The modulator 108 may comprise suitable logic, circuitry, interfaces, and/or code that may be operable to impress the output of the LPF 106 onto one or more carrier signals 120. The modulator 108 may be operable to perform, for example, frequency modulation, phase modulation, amplitude modulation, or some combination thereof. The modulation performed by the modulator 108 may be determined by the wireless standard(s) and/or protocol(s) in use.

The PAD 110 may comprise suitable logic, circuitry, interfaces, and/or code that may be operable to amplify the signal output by the modulator 108, and/or to impedance match the output of the modulator 108 to the PA 112. The PAD 110 is described in more detail below with respect to FIGS. 3A and 3B.

The PA 112 may comprise suitable logic, circuitry, interfaces, and/or code that may be operable to amplify the signal output by the PAD 110, and/or to impedance match the output of the PAD to the antenna 114. The gain of the PA 110 may be adjustable based on, for example, one or more control signals from the baseband processor 102 and/or the processor 116.

In operation, the baseband processor 102 may generate a baseband signal 102 corresponding to information to be transmitted. The output of the baseband processor 102 may be converted to an analog representation by the DAC 104. The analog baseband signal may be filtered by the LPF 106 and modulated onto one or more carrier signals by the modulator 108. The modulated signal output by the modulator 108 may be amplified by the PAD 110 and further amplified by the PA 112 for transmission via the antenna 114.

Figure 2A:
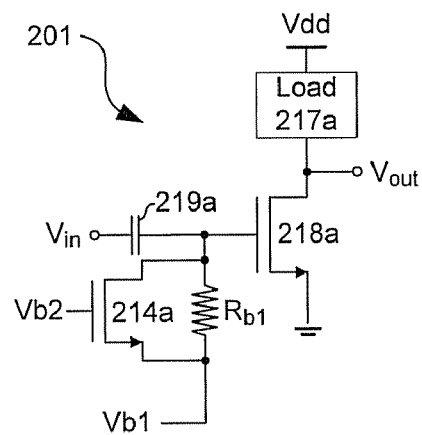
FIG. 2A is a diagram of a linearized single-transistor amplifier, in accordance with an embodiment of the invention.

FIG. 2A is a diagram of a linearized single-transistor amplifier, in accordance with an embodiment of the invention. Referring to FIG. 2A, there is shown an amplifier 201 comprising a first transistor 218a, a load 217a, a resistor $R_{b1}$, a second transistor 214a, and a capacitor 219a.

The transistor 218a may be an NMOS transistor configured in a common-source configuration. The load 217a may comprise, for example, a resistor or a transistor. A first terminal of the load 217a may be coupled to a supply voltage Vdd and a second terminal of the load 217a may be coupled to a drain of the transistor 218a. A source of the transistor 218a may be coupled to GND which may be, for example, earth ground, chassis ground, and/or AC ground. An input signal may be AC coupled to the gate of the transistor 218a via the capacitor 219a.

In operation, bias voltages Vb1 and Vb2 may be chosen such that transistor 218a operates in the active region and transistor 214a operates in the subthreshold region. The transistor 214a operating in the subthreshold region may offset at least some of the nonlinearity of the transistor 218a and/or the load 217a, thus improving the linearity of the amplifier 201 as compared to if the transistor 214a was not present.

Figure 2B:
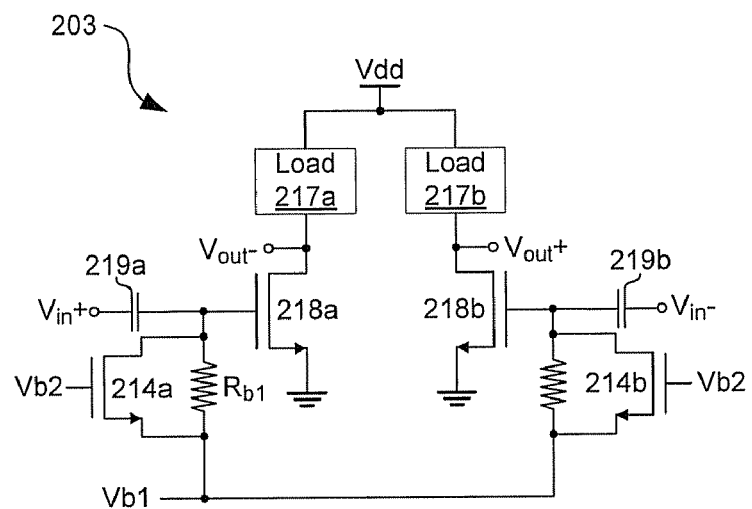
FIG. 2B is a diagram of a linearized differential amplifier, in accordance with an embodiment of the invention.

FIG. 2B is a diagram of a linearized differential amplifier, in accordance with an embodiment of the invention. Referring to FIG. 2B, there is shown a differential amplifier 203 comprising a transistors 218a and 218b, loads 217a and 217b, resistor $R_{b1}$ and $R_{bs}$, transistors 214a and 214b, capacitors 219a and 219b, and current source 221.

The transistors 218a and 218b may be configured as a differential pair where each of the transistors 218a and 218b is configured in a common-source configuration with their sources coupled to common AC ground. The first terminal of each of the loads 217a and 217b may be coupled to Vdd. A second terminal of load 217a may be coupled to the drain of transistor 218a and a second terminal of load 217b may be coupled to the drain of transistor 218b.

In operation, bias voltages Vb1 and Vb2 may be chosen such that transistors 218a and 218b operate in the active region and transistors 214a and 214b operate in the subthreshold region. The transistors 214a and 214b operating in the subthreshold region may offset at least some of the nonlinearity of the transistors 218a and 218b and/or the loads 217a and 217b, thus improving the linearity of the amplifier 203 as compared to if the transistors 214a and 214b were not present.

Figure 3A:
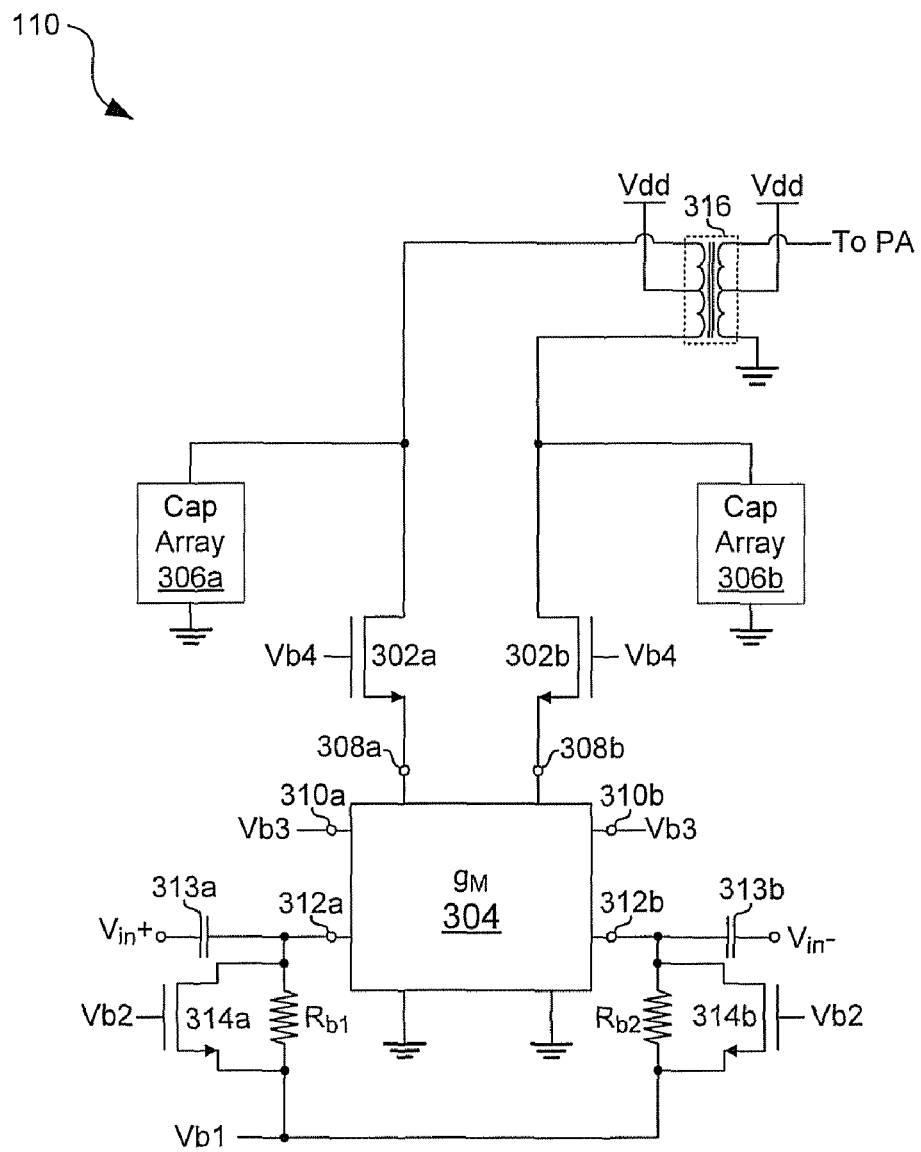
FIGS. 3A and 3B are diagrams illustrating an exemplary linearized power amplifier driver, in accordance with an embodiment of the invention.
Figure 3B:
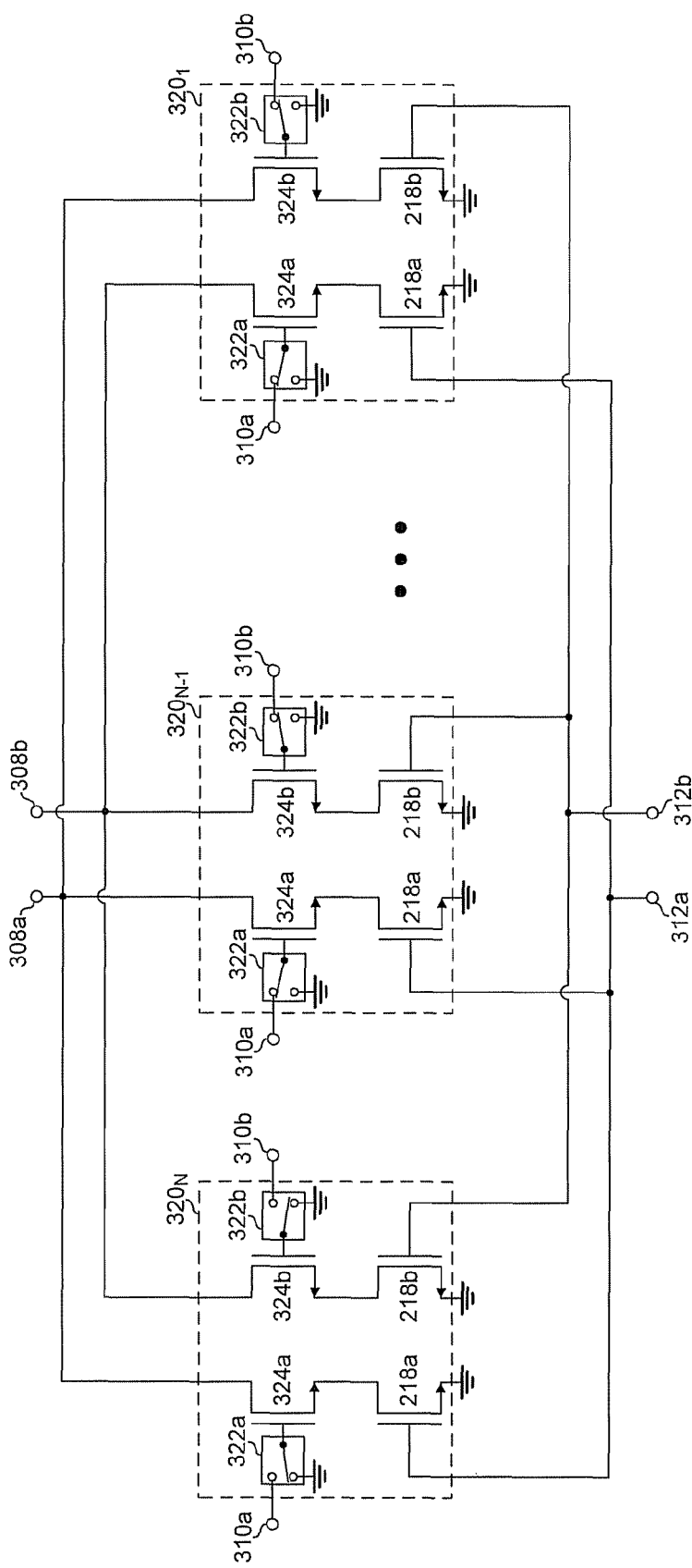

FIGS. 3A and 3B are diagrams illustrating an exemplary linearized power amplifier driver, in accordance with an embodiment of the invention. Referring to FIG. 3A, the power amplifier driver (PAD) 112 may comprise transistors 302a and 302b, transconductance ($g_M$) 304, capacitor arrays 306a and 306b, transformer 316, and transistors 314a and 314b. In an embodiment of the invention, one or more portions of the PAD 110 may be realized on a single integrated circuit die. For example, the PAD 110 may be implemented as part of a system on chip (SoC) along with one or more of the other portions of the receiver 100.

The capacitor arrays 306a and 306b may comprise, for example, one or more digitally selectable capacitors such that an overall capacitance of each of the capacitor arrays 306a and 306b may be determined based on a respective control signal applied to the array. The capacitance of the capacitor arrays 306a and 306b may be controlled based on, for example, process, voltage, and/or temperature variations. The capacitance of the capacitor arrays 306a and 306b may be controlled based on, for example, characteristics such as amplitude and/or frequency of a signal to be amplified by the PAD 110. The capacitance of the capacitor arrays 306a and 306b may be controlled based on, for example, wireless standard according to which the device 100 is to transmit. The capacitance of the capacitor arrays 306a and 306b may be controlled based on, for example, a desired gain of the PAD 110 and/or which of the $g_M$ cells $320_1$-$320_N$ are enabled.

Referring to FIG. 3B, the transconductance 304 may comprise a plurality of gM cells $320_1$-$320_N$, where N is an integer greater than or equal to 1. Each cell may comprise transistors 218a and 218b configured as a differential pair, cascode transistors 324a and 324b, and switching elements 322a and 322b.

The ports 308, 310, and 312 in FIG. 3B correspond, respectively, to the ports 308, 310, and 312 in FIG. 3A, thus illustrating the coupling of the $g_M$ cells $320_1$-$320_N$ shown in FIG. 3B to other portions of the PAD 110 shown in FIG. 3A.

In operation, the switching elements 322a and 322b of each of the $g_M$ cells $320_1$-$320_N$ may be controlled via one or more control signals based on a desired gain of the transconductance 304. More $g_M$ cells $320_1$-$320_N$ being enabled may correspond to higher gain. A particular $g_M$ cell $320_X$ may be enabled, that is, may contribute significantly to the output current of the transconductance 304, when the cascode transistors of that $g_M$ cell $320_X$ are coupled to bias voltage Vb3 via ports 210a and 210b. A particular $g_M$ cell $320_X$ may be disabled, that is, may not contribute significantly to the output current of the transconductance 304, when the cascode transistors of that $g_M$ cell $320_X$ are coupled to AC ground.

Returning to FIG. 3A, bias voltages Vb1, Vb2, Vb3, Vb4 may be predetermined or dynamically controlled during operation of the PAD 110 such that transistors 218a and 218b of each enabled one of the $g_M$ cells $320_1$-$320_N$ operates in the active region and transistors 214a and 214b operate in the subthreshold region. The transistors 214a and 214b operating in the subthreshold region may offset at least some of the nonlinearity resulting from the other components of the PAD 112, thus improving the linearity of the PAD 112 as compared to if the transistors 214a and 214b were not present.

In operation, a differential input signal may be input to ports 312a and 312b via capacitors 313a and 313b. Changes in the differential input voltage may cause a current in the primary winding of the transformer 316, which may, in turn, induce a current in the second winding of the transformer 316. The signal in the second winding of the transformer 316 may be input to the PA 112 (FIG. 1) for amplification and transmission via the antenna 114 (FIG. 1).

In an exemplary embodiment of the invention, each of the transistors 314a and 314b may comprise an array of transistors which may be configurable via one or more control signals. For example, the effective channel width of the transistors 314a and 314b may be controlled by enabling and/or disabling, or connecting and/or disconnecting, one or more of a plurality of transistors coupled in parallel. In such an embodiment, the width of the transistors 314a and 314b may then be controlled based on, for example, process, voltage, and/or temperature variations; voltage, frequency, or other characteristics of a signal to be amplified by the PAD 110; and/or a wireless standard according to which the device 100 is to transmit.

Although each of FIGS. 2A, 2B, 3A, and 3B utilizes NMOS transistors for illustration, the invention is not so limited. The corresponding configurations utilizing PMOS transistors may be equally useful, or even preferable, in some circumstances.

Figure 4:
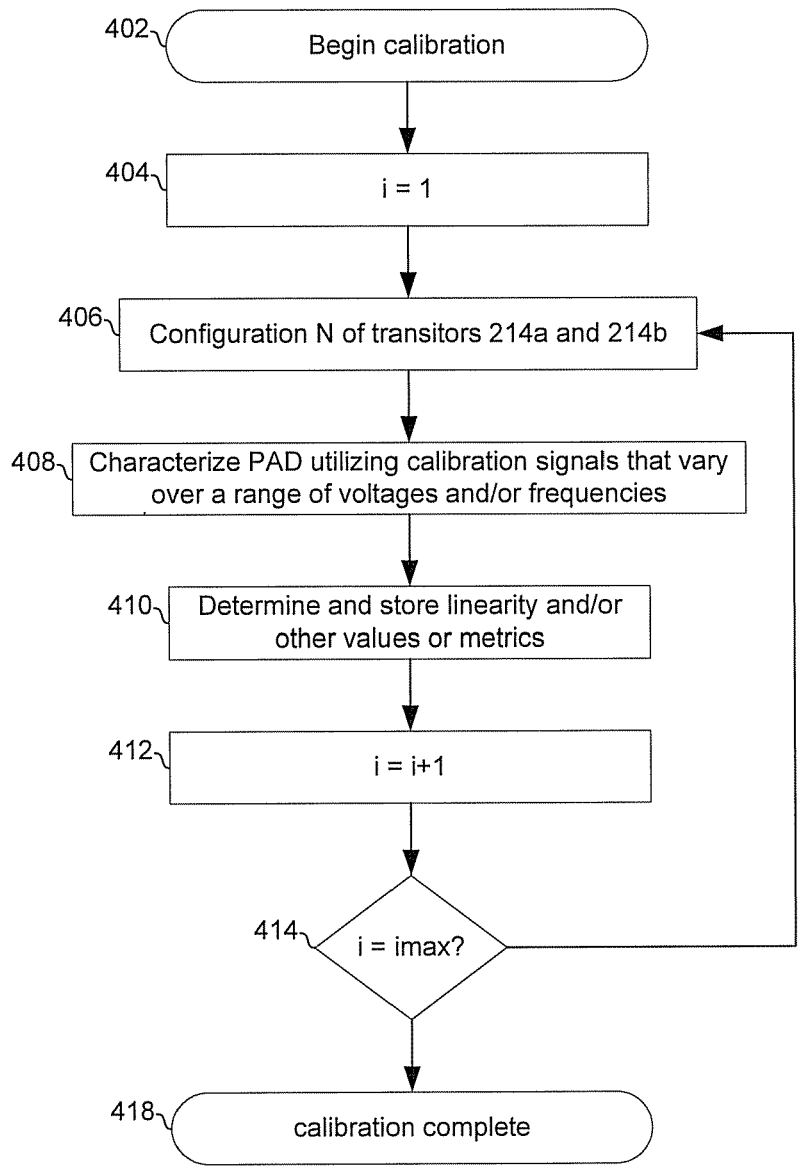
FIG. 4 is a flowchart illustrating exemplary steps for characterization of a power amplifier driver linearized via one or more configurable transistors, in accordance with an embodiment of the invention.

FIG. 4 is a flowchart illustrating exemplary steps for characterization of a power amplifier driver linearized via one or more configurable transistors, in accordance with an embodiment of the invention. Referring to FIG. 4, the exemplary steps may begin with step 402 in which a characterization may be initiated. The characterization may be, for example, a function built in to the device 100 and/or may be performed in a factory setting. In step 404, a counter i may be initialized to 1. In step 406, each of transistors 214a and 214b may be configured into an $i^{th}$ configuration. For example, each of imax configurations of the transistor 214a may correspond to a different effective channel width of the transistor 214b. In step 408, one or more calibration signals may be input to the PAD 110 to characterize the PAD over, for example, voltage, temperature, and/or frequency. In steps 410, linearity and/or other metrics of the PAD associated with the Nth configuration of the transistors 214a and 214b may be stored to memory. In step 412, the counter i may be incremented by 1. In step 414, it may be determined whether the counter has reached a maximum value imax. If not, the exemplary steps may return to step 406. If i is equal to imax, then the exemplary steps may advance to step 418 and characterization may be complete.

Figure 5:
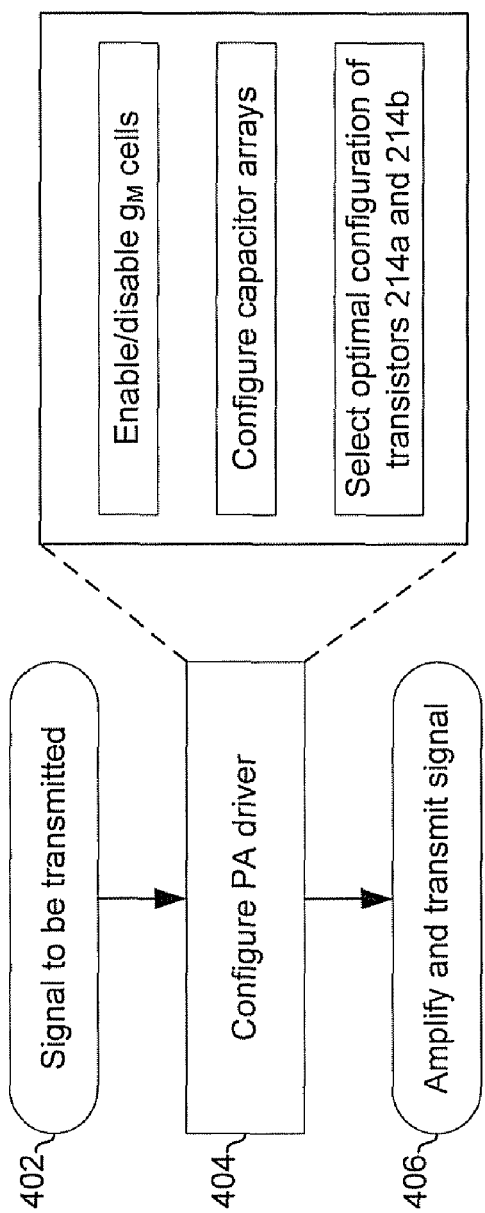
FIG. 5 is a flowchart illustrating exemplary steps for transmission via a linearized transmitter, in accordance with an embodiment of the invention.

FIG. 5 is a flowchart illustrating exemplary steps for transmission via a linearized transmitter, in accordance with an embodiment of the invention. Referring to FIG. 5, the exemplary steps may begin with step 502 in which the device 100 may have a signal to be transmitted. In step 504 the PAD 110 may be configured for transmission of the signal. In this regard, the PAD 110 may be configured based on, for example, temperature, supply and/or bias voltage levels, voltage levels of a signal input to the PAD, voltage and/or current levels to be output by the PAD 110, and/or a frequency of a signal to be amplified by the PAD 110. Configuration of the PAD 110 may comprise enabling and/or disabling one or more of the $g_M$ cells $320_1$-$320_N$ as described with respect to FIG. 3B. Configuration of the PAD 110 may comprise configuring the capacitor arrays 306a and 306b as described with respect to FIG. 3A above. Configuration of the PAD 110 may comprise selecting an optimal configuration of the transistors 314a and 314b, where the optimal configuration of the transistors 314a and 314b may be determined based on information stored during the characterization described above in FIG. 4.

Various aspects of a method and system for transmitter linearization are provided. In various embodiments of the invention, a signal may be amplified via one or more circuits 110 comprising a first transistor 218a having a first bias voltage Vb1 applied to its gate via a resistor Rb1, and a second transistor 314a having its source coupled to a first terminal of the resistor Rb1, its drain coupled to a second terminal of the resistor Rb1, and its gate coupled to a second bias voltage Vb2. The signal may be AC-coupled, via one or more capacitors 313, for example, to the gate of the first transistor 218a. The first bias voltage Vb1 and the second bias voltage Vb2 may be such that the first transistor 218a operates in the active region the second transistor 314a operates in the subthreshold region. The first transistor 218a may be in a common-source configuration. The first transistor 218a may be one transistor of a differential pair comprising transistors 218a and 218b. The effective channel width of the second transistor 314 may be configurable during operation of the one or more circuits 110. The effective channel width of the second transistor 314 may be configured based on, for example, characteristics of the signal, temperature, and/or supply voltage provided to the one or more circuits.

The one or more circuits 110 may comprise a plurality of transconductance cells 320, wherein each of the plurality of transconductance cells 320 may be configurable, during operation of the one or more circuits 110, between an enabled configuration and a disabled configuration. Each of the plurality of transconductance cells 320 may comprise two instances 218a and 218b of the first transistor configured as a differential pair. Each of the plurality of transconductance cells 320 may comprise one or more cascode transistors 324 and may be enabled or disabled based on a voltage applied to a gate of the one or more cascade transistors 324.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for transmitter linearization.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method, comprising:
amplifying a signal via one or more circuits that comprise:
a first transistor having a first bias voltage applied to its gate via a resistor;
a second transistor having its source coupled to a first terminal of said resistor, its drain coupled to a second terminal of said resistor, and its gate coupled to a second bias voltage, wherein:
said first bias voltage and said second bias voltage coincide with said first transistor operating in its active region and said second transistor operating in its subthreshold region; and
said signal is AC-coupled to the gates of said first transistor.

2. The method according to claim 1, wherein said first transistor is in a common-source configuration.

3. The method according to claim 1, wherein said transistor is one transistor of a differential pair.

4. The method according to claim 1, wherein an effective channel width of said second transistor is configurable during operation of said one or more circuits.

5. The method according to claim 3, wherein said effective channel width of said second transistor is configured based on characteristics of said signal.

6. The method according to claim 3, wherein said effective channel width of said second transistor is configured based on temperature.

7. The method according to claim 3, wherein said effective channel width of said second transistor is configured based on a supply voltage provided to said one or more circuits.

8. The method according to claim 1, wherein said one or more circuits comprise a plurality of transconductance cells, wherein each of said plurality of transconductance cells is configurable between an enabled configuration and a disabled configuration during operation of said one or more circuits.

9. The method according to claim 6, wherein each of said plurality of transconductance cells comprises two instances of said first transistor configured as a differential pair.

10. The method according to claim 6, wherein each of said plurality of transconductance cells comprises one or more cascode transistors and is enabled or disabled based on a voltage applied to a gate of said one or more cascode transistors.

11. A system, comprising:
one or more circuits for amplifying a signal, said one or more circuits comprise:
a first transistor having a first bias voltage applied to its gate via a resistor;
a second transistor having its source coupled to a first terminal of said resistor, its drain coupled to a second terminal of said resistor, and its gate coupled to a second bias voltage, wherein:
said first bias voltage and said second bias voltage coincide with said first transistor operating in its active region and said second transistor operating in its subthreshold region; and
said signal is AC-coupled to the gates of said first transistor.

12. The system according to claim 11, wherein said first transistor is in a common-source configuration.

13. The system according to claim 11, wherein said transistor is one transistor of a differential pair.

14. The system according to claim 11, wherein an effective channel width of said second transistor is configurable during operation of said one or more circuits.

15. The system according to claim 13, wherein said effective channel width of said second transistor is configured based on characteristics of said signal.

16. The system according to claim 13, wherein said effective channel width of said second transistor is configured based on temperature.

17. The system according to claim 13, wherein said effective channel width of said second transistor is configured based on a supply voltage provided to said one or more circuits.

18. The system according to claim 11, wherein said one or more circuits comprise a plurality of transconductance cells, wherein each of said plurality of transconductance cells is configurable between an enabled configuration and a disabled configuration during operation of said one or more circuits.

19. The system according to claim 16, wherein each of said plurality of transconductance cells comprises two instances of said first transistor configured as a differential pair.

20. The system according to claim 16, wherein each of said plurality of transconductance cells comprises one or more cascode transistors and is enabled or disabled based on a voltage applied to a gate of said one or more cascode transistors.

* * * * *